(12) United States Patent
Kurunczi et al.

(10) Patent No.: US 8,471,476 B2
(45) Date of Patent: Jun. 25, 2013

(54) INDUCTIVELY COUPLED PLASMA FLOOD GUN USING AN IMMERSED LOW INDUCTANCE FR COIL AND MULTICUSP MAGNETIC ARRANGEMENT

(75) Inventors: Peter F. Kurunczi, Cambridge, MA (US); Victor M. Benveniste, Lyle, WA (US); Oliver V. Naumovski, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 230 days.

(21) Appl. No.: 12/901,198

(22) Filed: Oct. 8, 2010

(65) Prior Publication Data
US 2012/0085917 A1 Apr. 12, 2012

(51) Int. Cl.
*H05B 31/26* (2006.01)
*H01J 37/317* (2006.01)

(52) U.S. Cl.
USPC ............. 315/111.21; 315/111.51; 250/492.21

(58) Field of Classification Search
USPC ....... 315/111.21, 111.51, 111.71; 250/396 R, 250/396 ML, 492.21
See application file for complete search history.

(56) References Cited

U.S. PATENT DOCUMENTS

| | | | |
|---|---|---|---|
| 5,354,381 A | 10/1994 | Sheng | |
| 5,399,871 A * | 3/1995 | Ito et al. | 250/492.21 |
| 5,434,353 A | 7/1995 | Kraus | |
| 5,576,538 A | 11/1996 | Sakai et al. | |
| 5,589,737 A | 12/1996 | Barnes et al. | |
| 5,668,368 A | 9/1997 | Sakai et al. | |
| 5,686,796 A * | 11/1997 | Boswell et al. | 315/111.51 |
| 5,757,018 A | 5/1998 | Mack et al. | |
| 5,877,471 A * | 3/1999 | Huhn et al. | 219/121.49 |
| 6,100,536 A | 8/2000 | Ito et al. | |
| 6,135,128 A | 10/2000 | Graf et al. | |
| 6,271,529 B1 | 8/2001 | Farley et al. | |

(Continued)

FOREIGN PATENT DOCUMENTS
EP 0880161 A1 11/1998

OTHER PUBLICATIONS
Nariaki Hamamoto et al., "Proceedings of RF Plasma Flood Gun for Medium Current Implanter," Sep. 2002, Proceedings of the 14th International Conference on Ion Implantation Technology, 207-310, IEEE, Piscataway, NJ.

(Continued)

*Primary Examiner* — Tung X Le (57) ABSTRACT

A device is disclosed for providing an inductively coupled radio frequency plasma flood gun. In one particular exemplary embodiment, the device is a plasma flood gun in an ion implantation system. The plasma flood gun may comprise a plasma chamber having one or more apertures; a gas source capable of supplying at least one gaseous substance to the plasma chamber; a single-turn coil disposed within the plasma chamber, and a power source coupled to the coil for inductively coupling radio frequency electrical power to excite the at least one gaseous substance in the plasma chamber to generate a plasma. The inner surface of the plasma chamber may be free of metal-containing material and the plasma may not be exposed to any metal-containing component within the plasma chamber. The plasma chamber may include a plurality of magnets for controlling the plasma. An exit aperture may be provided in the plasma chamber to enable negatively charged particles of the resulting plasma to engage an ion beam that is part of the associated ion implantation system. In one embodiment, magnets are disposed on opposite sides of the aperture and are used to manipulate the electrons of the plasma.

23 Claims, 8 Drawing Sheets

U.S. PATENT DOCUMENTS

| | | | |
|---|---|---|---|
| 6,313,428 B1 | 11/2001 | Chen et al. | |
| 6,388,381 B2 * | 5/2002 | Anders | 315/111.21 |
| 6,506,685 B2 | 1/2003 | Li et al. | |
| 6,548,381 B2 | 4/2003 | Hamamoto | |
| 6,589,437 B1 | 7/2003 | Collins | |
| 6,686,599 B2 | 2/2004 | Hamamoto et al. | |
| 6,686,601 B2 | 2/2004 | Murrell et al. | |
| 6,815,697 B2 | 11/2004 | Sano et al. | |
| 6,851,384 B2 | 2/2005 | Yuda et al. | |
| 7,126,138 B2 | 10/2006 | Ito et al. | |
| 2002/0088950 A1 | 7/2002 | Hamamoto et al. | |
| 2002/0164845 A1 | 11/2002 | Hamamoto | |
| 2002/0185226 A1 | 12/2002 | Lea et al. | |
| 2004/0011465 A1 | 1/2004 | Matsumoto et al. | |
| 2004/0011466 A1 * | 1/2004 | Matsumoto et al. | 156/345.48 |
| 2004/0070348 A1 | 4/2004 | Ichiki et al. | |
| 2004/0222367 A1 | 11/2004 | Ichiki et al. | |
| 2005/0116156 A1 | 6/2005 | Ito et al. | |
| 2005/0170669 A1 | 8/2005 | Okumura et al. | |
| 2006/0113492 A1 * | 6/2006 | Kawaguchi et al. | 250/492.21 |
| 2006/0169912 A1 * | 8/2006 | Renau et al. | 250/396 ML |
| 2006/0172517 A1 * | 8/2006 | Brown et al. | 438/584 |
| 2007/0137576 A1 * | 6/2007 | Kurunczi et al. | 118/723 R |
| 2009/0114815 A1 | 5/2009 | Vanderberg et al. | |
| 2010/0304046 A1 * | 12/2010 | Miyake et al. | 427/569 |

OTHER PUBLICATIONS

Fukasawa, Takayuki, et al., RF Self-Bias Characteristics in Inductively Coupled Plasma, Japanese Journal of Applied Physics, Dec. 30, 1993, pp. 6076-6079, vol. 32, Part 1, No. 12B.

* cited by examiner

INDUCTIVELY COUPLED PLASMA FLOOD GUN USING AN IMMERSED LOW INDUCTANCE FR COIL AND MULTICUSP MAGNETIC ARRANGEMENT

BACKGROUND OF THE INVENTION

1. Field of the Invention

Embodiments of the invention relate to the field of ion implantation of semiconductor structures. More particularly, the present invention relates to a plasma flood gun having an immersed RF coil and offset multicusp aperture for generating and directing a low energy plasma into contact with an ion beam.

2. Discussion of Related Art

Ion implantation is a process used to dope impurity ions into a substrate such as, for example, a semiconductor wafer. Generally, an ion beam is directed from an ion source chamber toward a substrate. Different feed gases are supplied to the ion source chamber to obtain plasma used to form ion beams having particular dopant characteristics. For example, from the feed gasses $PH_3$, $BF_3$, or $AsH_3$, various atomic and molecular ions are created within the ion source, and subsequently accelerated and mass selected. The depth of implantation of the generated ions into the substrate is based on the ion implant energy and the mass of the ions. One or more types of ion species may be implanted in the target wafer or substrate in different doses and at different energy levels to obtain desired device characteristics. A precise doping profile in the substrate is critical to proper device operation.

During the implantation process, bombardment of positively charged ions on the target substrate may result in the build-up of a positive charge on insulated portions of the wafer surface and lead to positive potentials thereon. The energetic ions can also contribute to further wafer charging through secondary electron emission from the wafer. The resulting positive potentials can create strong electric fields in some miniature structures, causing permanent damage. A plasma flood gun (PFG) can be used to alleviate this charge buildup. In particular, a PFG may typically be located near the platen close to the incoming ion beam just before it makes its impact on a wafer or target substrate. The PFG often comprises a plasma chamber wherein a plasma is generated through ionization of atoms of an inert gas such as argon (Ar), xenon (Xe) or krypton (Kr). Low-energy electrons from the plasma are introduced into the ion beam and drawn towards the target wafer to neutralize the excessively positively charged wafer.

Existing PFGs suffer from a number of drawbacks. One significant drawback is that of metal contamination. In particular, certain conventional PFGs use a hot tungsten filament for plasma generation. During operation, the tungsten filament is gradually consumed and tungsten atoms may contaminate the ion implantation system as well as the process wafers. Another common source of metal contaminants is the PFG plasma chamber itself. The inner surface of the plasma chamber often contains one or more metals or metal compounds. Constant exposure of the inner surface to plasma discharge may free metal atoms into the ion implantation system. Metal electrodes or other metal components placed inside the plasma chamber may cause similar contaminations.

Although the contamination problem might be alleviated by constructing a plasma chamber completely out of a dielectric material, such a solution may not be desirable because the nonconductive inner surface increases plasma potential and consequently affects the energy of the emitted electrons. For charge neutralization in an ion implantation system, a relatively low electron energy is generally preferred. Low energy electrons can readily be trapped within the positive electric potential of the ion beam and then travel within the beam towards a positively charged wafer. In comparison, excessively energetic electrons can escape from the beam and not arrive at the wafer. Also, excessively energetic electrons, if they arrive at the wafer, can lead to net negative charging on the wafer surface. This can result in the build-up of excess negative charge on the wafer surface where the degree to which such a negative electrostatic charge can accumulate on the wafer surface is related to the energy of the electrons arriving at the wafer.

A further challenge in designing a PFG is to make it compact enough to fit into a predefined space reserved for an existing PFG without requiring substantial modifications to existing ion implantation systems. It is often economically unfeasible to modify a mature ion implantation system just to accommodate a new PFG. Thus, upgrading a PFG for an otherwise operable ion implanter requires a PFG design that can easily be retrofitted into current systems. Thus, there is a need to provide a PFG which overcomes the above-described inadequacies and shortcomings.

SUMMARY OF THE INVENTION

Exemplary embodiments of the present invention are directed to a plasma flood gun having an immersed RF coil and offset multicusp aperture for generating and directing low energy electrons into contact with an ion beam. In an exemplary embodiment, a plasma flood gun for use in ion implantation systems comprises a plasma chamber having an exit aperture, a gas source, a single-turn radio-frequency (RF) coil and a power source. The gas source is capable of supplying a gaseous substance to the plasma chamber. The single-turn RF coil is disposed within the plasma chamber and the power source is coupled to the RF coil for inductively coupling RF electrical power into the plasma chamber via the RF coil exciting the gaseous substance to generate a plasma. The exit aperture of the plasma chamber has a width sufficient to allow charged particles of the plasma to flow therethrough.

In an exemplary method for providing a plasma flood gun in an ion implantation system, a plasma chamber is provided having an exit aperture where the entire inner surface of the plasma chamber is free of metal or metal compound. At least one gaseous substance is supplied to the plasma chamber and a plasma is generated having charged particles by coupling RF power into the plasma chamber via a single-turn coil disposed within the plasma chamber which excites the at least one gaseous substance. At least a portion of the charged particles from the plasma exit the plasma chamber via the one or more apertures.

DESCRIPTION OF EMBODIMENTS

Ion implanters are widely used in semiconductor manufacturing to selectively alter conductivity of materials. In a typical ion implanter, ions generated from an ion source are directed through a series of beam-line components that may include one or more analyzing magnets and a plurality of electrodes. The beam-line components select desired ion species, filter out contaminant species and ions having undesirable energies, and adjust ion beam quality at a target wafer. Suitably shaped electrodes may modify the energy and the shape of an ion beam.

Figure 1:
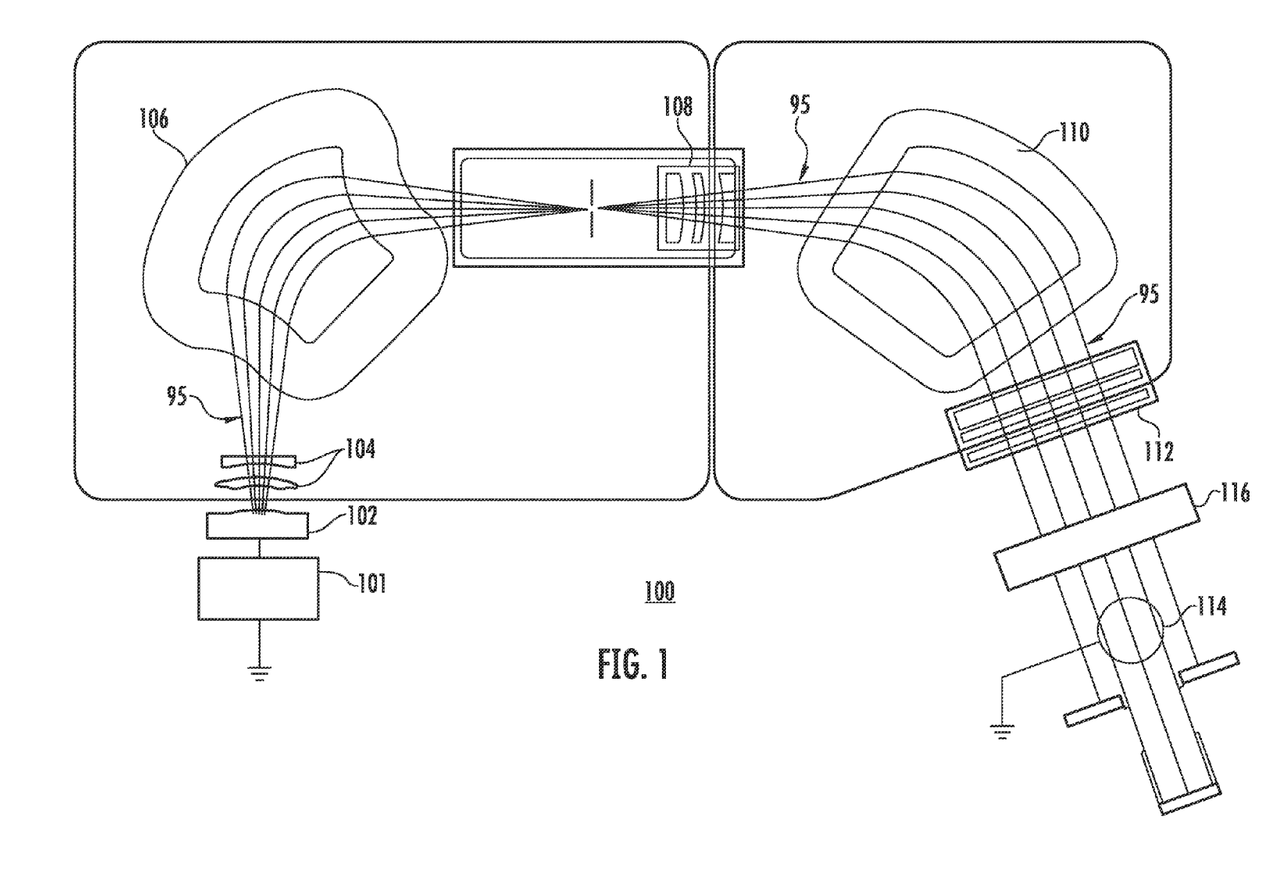
FIG. 1 depicts an ion implanter system incorporating the disclosed plasma flood gun in accordance with an embodiment of the present disclosure.

An exemplary high current ion implanter tool 100 is generally shown in FIG. 1 and includes an ion source chamber 102, and a series of beam line components that direct the ion beam to a wafer or substrate. These components are housed in a vacuum environment and configured to provide ion dose levels with high or low energy implantation based on the desired implant profile. In particular, implanter 100 includes an ion source chamber 102 to generate ions of a desired species. The chamber has an associated hot cathode powered by power supply 101 to ionize feed gas introduced into the chamber 102 to form charged ions and electrons (plasma). The hot cathode may be, for example, a heated filament or an indirectly heated cathode.

Different feed gases are supplied to the source chamber to generate ions having particular dopant characteristics. The ions may be extracted from source chamber 102 via a standard three (3) extraction electrode configuration used to create a desired electric field to focus ion beam 95 extracted from source chamber 102. Beam 95 passes through a mass analyzer chamber 106 having a magnet which functions to pass only ions having the desired charge-to-mass ratio to a resolving aperture. In particular, the analyzer magnet can include a curved path where beam 95 is exposed to the applied magnetic field which causes ions having the undesired charge-to-mass ratio to be deflected away from the beam path. Deceleration stage 108 (also referred to as a deceleration lens) may include a plurality of electrodes (e.g. three) with a defined aperture and is configured to output the ion beam 95. A magnet analyzer 110 is positioned downstream of deceleration stage 108 and is configured to deflect the ion beam 95 into a ribbon beam having parallel trajectories. A magnetic field may be used to adjust the deflection of the ions via a magnetic coil.

The ion beam 95 is targeted toward a work piece which is attached to a support or platen 114. An additional deceleration stage 112 may also be utilized which is disposed between collimator magnet chamber 110 and support 114. Deceleration stage 112 (also referred to as a deceleration lens) is positioned close to a target substrate on platen 114 and may include a plurality of electrodes (e.g. three) to implant the ions into the target substrate at a desired energy level. Because the ions lose energy when they collide with electrons and nuclei in the substrate, they come to rest at a desired depth within the substrate based on the acceleration energy. The ion beam may be distributed over the target substrate by beam scanning, by substrate movement using platen 114, or by a combination of beam scanning and substrate movement. A plasma flood gun (PFG) 116 can be positioned immediately upstream of the platen 114 to apply plasma to the ion beam just before the beam impacts the substrate.

Figure 2:
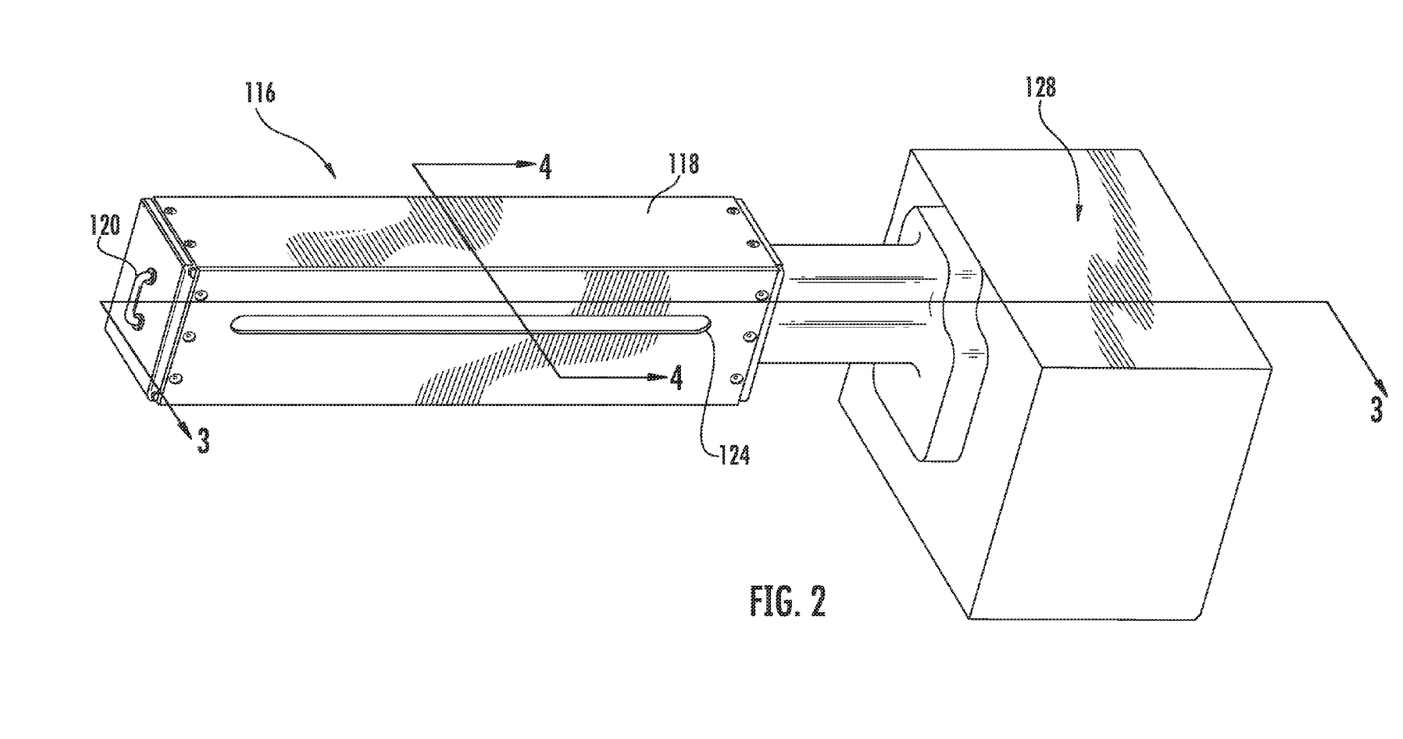
FIG. 2 is a perspective view of the disclosed plasma flood gun in accordance with an embodiment of the present disclosure.
Figure 3:
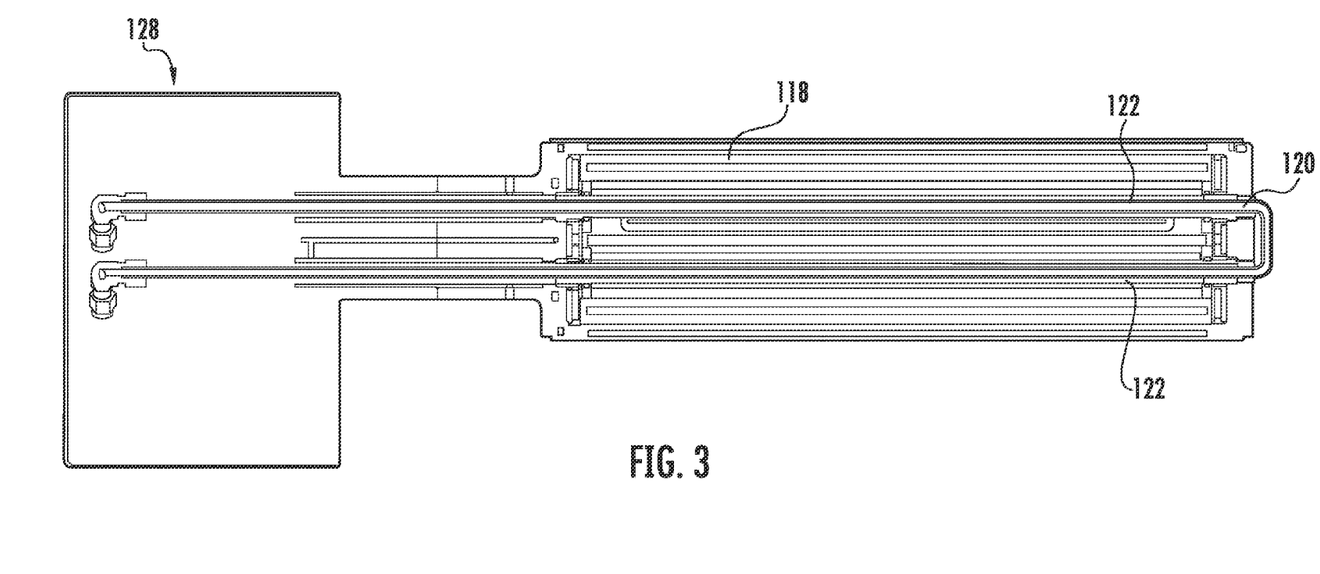
FIG. 3 is a cross-section view of the disclosed plasma flood gun taken alone line 3-3 of FIG. 2 in accordance with an embodiment of the present disclosure.
Figure 4:
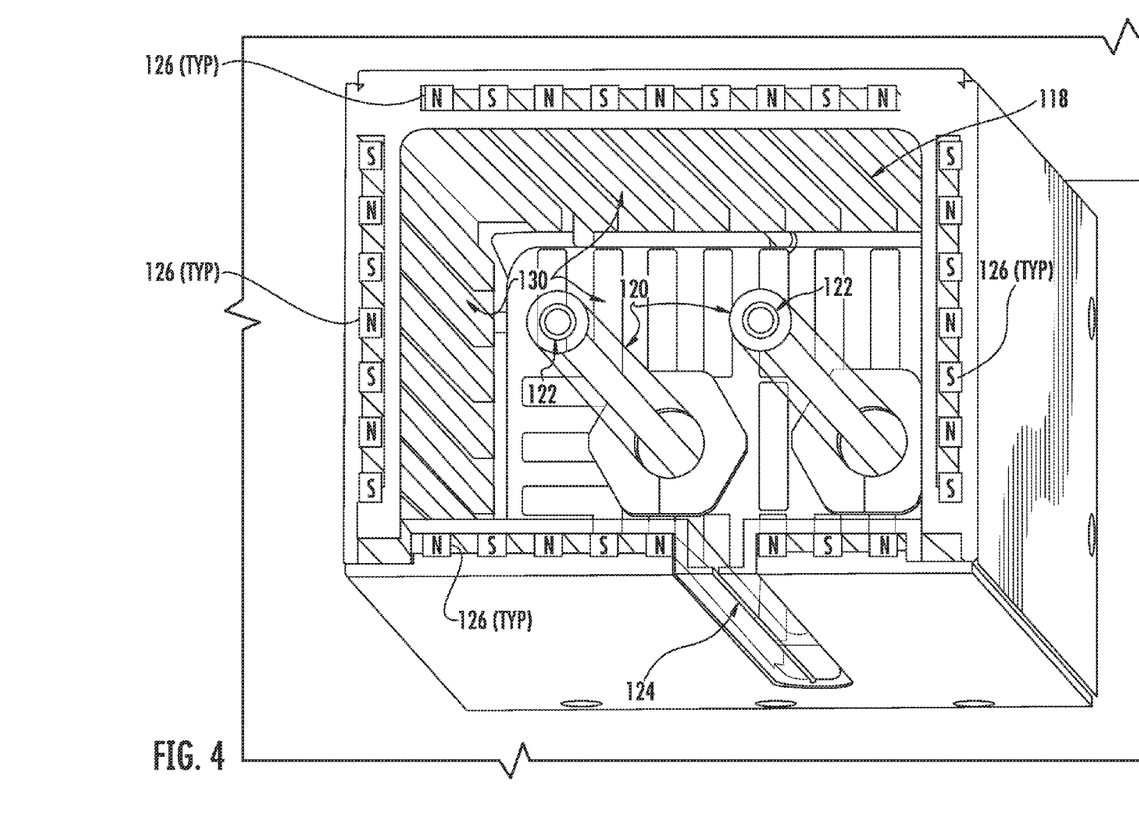
FIG. 4 is a cross-section view of the disclosed plasma flood gun taken along line 4-4 of FIG. 2 in accordance with an embodiment of the present disclosure.

Referring to FIGS. 2-4, an exemplary PFG 116 is shown which generally comprises a plasma chamber 118 that has a substantially metal-free inner surface. A radio-frequency (RF) coil 120 may be disposed within the plasma chamber 118 for directly exciting a gas enclosed in the chamber, thereby creating and maintaining a desired plasma. Since the RF coil is metal, it is enclosed within a casing 122 that protects the coil 120 from exposure to the plasma within the chamber, thus preventing deterioration of the coil and limiting contamination of the plasma from metal ions. The plasma chamber 118 may have, on one side, an elongate aperture 124 through which the plasma can flow out of the chamber and into engagement with the ions of ion beam 95. A series of permanent magnets 126 are disposed about the plasma chamber 118 to contain and control the plasma created therein. In particular, the permanent magnets are positioned outside the walls of the plasma chamber 118 and their respective magnetic fields extend through the wall of the chamber. As will be discussed in greater detail below, the characteristics of these magnets can be controlled to obtain desired characteristics of the plasma as it exits the chamber through aperture 124. The PFG 116 also includes an appropriate control system 128 for controlling operation of the power applied to the RF coil.

The interior portions of the plasma chamber 118, such as the sidewalls 130, may be made out of a non-metallic conductive material such as graphite or silicon carbide (SiC). Alternatively, the interior portions of the inner surface may have a coating of a non-metallic conductive material (e.g., graphite or SiC). The coating may be applied over either a metal or non-metal surface. Alternatively, interior surfaces of the plasma chamber 118 may comprise exposed aluminum (Al) or aluminum-containing materials (e.g., aluminum oxide or $Al_2O_3$). Alternatively, one portion of the interior surface may be coated with a non-metallic conductive material while another portion may comprise exposed aluminum.

The coil 120 and/or the sidewalls 130 may be cooled with water or other coolants. For example, the coil 120 and the sidewall 130 may be hollow to allow circulation of a coolant therein. A feed-through gas pipe (not shown) may be provided in a sidewall of the plasma chamber 118 through which one or more gaseous substances may be supplied to the plasma chamber. The gaseous substances may include inert gases such as xenon (Xe), argon (Ar) or Krypton (Kr). The gas pressure is typically maintained in a range of 1-50 mTorr.

As can be seen, the coil 120 may have an elongated shape that extends generally through the center of the plasma chamber 118. One end of the coil 120 may be connected to an RF power supply, which is provided as part of the control system 128 and may inductively couple RF electrical power in the plasma chamber 118. The RF electrical power may operate at typical frequencies allocated to industrial, scientific and medical (ISM) equipment, such as, for example, 2 MHz, 13.56 MHz and 27.12 MHz.

As shown, the coil 120 comprises a single-turn, and is isolated from surrounding plasma by quartz tubes 122. The coil 120 may be completely enclosed within the plasma chamber 118, or it may have a portion that connects to, or extends through, a wall of the plasma chamber. FIGS. 2 and 3 show an arrangement in which the end of the coil that is opposite the control system 128 extends through the plasma chamber wall. Such an arrangement provides enhanced structural support for the coil 120 as well as allowing the coil to be bent without having the problems associated with maintaining the quartz surround.

Providing the coil 120 in a single-turn configuration enables the system to operate at low inductance and low impedance, which allows higher current to be driven through the coil with lower driving voltage. Lower driving voltage, in turn, reduces capacitive heating of the plasma electrons, thus creating a low electron temperature plasma. Higher coil current also provides more inductive coupling and higher plasma density for a given input power. For example, inductances of less than 2 micro Henries with coil voltages of less than 1000 volts peak, and plasma electron temperatures of less than 3 electron volts (eV) may be employed using the single-turn coil 120 configuration. In addition, the disclosed immersed coil design provides more efficient inductive coupling because it couples energy in all directions into the plasma, as opposed to prior designs whose coils reside on only one side of the plasma chamber. The efficiency of the disclosed design allows for an extended output along the length of the ribbon beam 95, providing more uniform charge neutralization as compared with prior designs, thus enhancing overall beam and wafer uniformity.

Figure 3A:
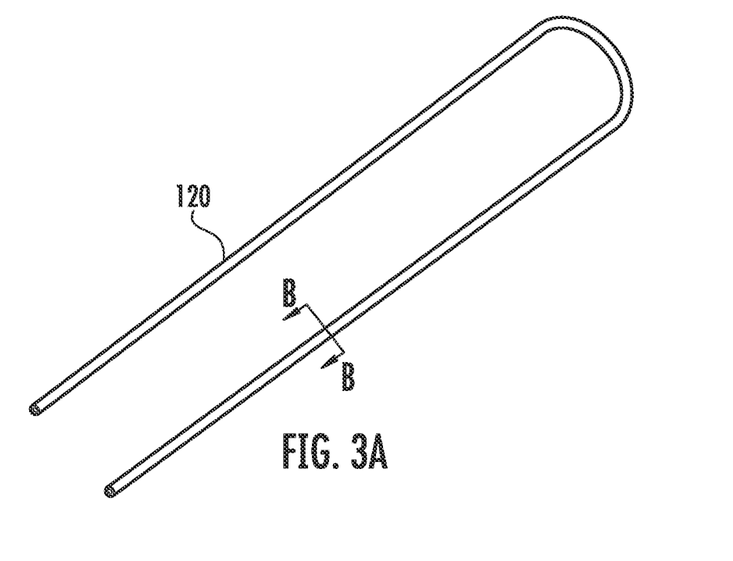
Figure 3B:
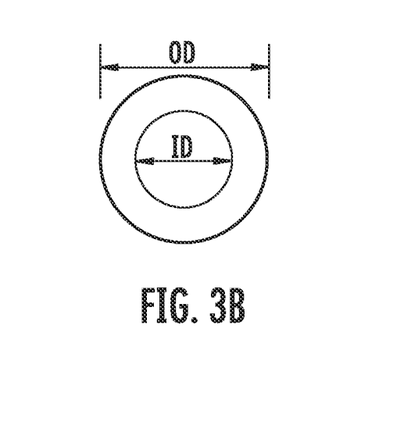

FIG. 3A shows an exemplary coil 120 for use as part of the disclosed PFG 116. As noted, the coil 120 may have an elongated shape with a single turn with a bend radius R, which may be in the range of ½-2 inches. The overall length of the coil 120 may be in the range of 8-24 inches. FIG. 3B shows a cross section of coil 120 taken along lines B-B in an embodiment where the coil is hollow. The coil 120 may have an outer diameter "OD" in the range of ¼ to ½ inch and an inner diameter "ID" in the range of ⅟₁₆ to ⅜ inches. The coil 120 may be made from aluminum or copper and the casing 122 can be made of quartz, ceramic, or similar material.

The RF electrical power coupled in the plasma chamber 118 via the coil 120 may excite the inert gases therein to generate a plasma. The shape and position of the plasma inside the plasma chamber 118 may be affected at least in part by the shape and position of the coil 120. According to some embodiments, the coil 120 may extend substantially the whole length of the plasma chamber 118. Due to the metal-free inner surface, the plasma chamber 118 may be constantly exposed to the plasma without introducing any metal contaminant.

In an ion implantation system, the PFG 116 is typically located near the ion beam 95 (FIG. 1) just before it reaches a target substrate disposed on platen 114. In a sidewall of the plasma chamber 118, an exit aperture 124 is positioned to allow the generated plasma to flow into contact with the ion beam 95. In the illustrated embodiment, a single exit aperture 124 is shown. It will be appreciated, however, that a plurality of smaller discrete exit apertures may be provided in an array that extends across a width of the ion beam 95. For a ribbon-shaped ion beam, the exit aperture 124 may cover substantially the ribbon width. In the case of a scanned ion beam, the exit aperture 124 may cover the scan width. According to one embodiment of the present disclosure, the exit aperture 124 may cover a width of 4-18 inches. Any of a variety of widths are achievable, as will be appreciated by one of ordinary skill in the art.

To allow charged particles (i.e., electrons and ions) from the plasma to pass through the exit aperture 124, the width "W" of the exit aperture 124 is typically greater than twice the sheath width of the plasma 10. According to one embodiment, it may be desirable for the plasma to form a plasma bridge with an ion beam passing just outside the plasma chamber 118. Therefore, it may be desirable that the width "W" of the exit aperture 124 be greater than twice the sheath width so that the aperture is wide enough to accommodate the plasma bridge. According to embodiments of the present disclosure, the simple design of the PFG 116 makes it adaptable to fit within a predefined space reserved for an older type PFG. Therefore, there may be no need to alter an existing PFG housing for the upgrade.

Although the PFG 116 has been described as having its exit aperture 124 facing directly down on (i.e., perpendicular to) the ion beam 95, other orientations are also contemplated. Thus, in one embodiment the PFG 116 or the exit aperture 124 may be tilted so that the plasma bridge joins the ion beam 95 at an angle. For example, the PFG 300 may be adapted so that electrons (or the plasma bridge) coming out of the exit aperture 124 are directed in a general direction of a wafer and join the ion beam 95 at a 45 degree angle. Other angles are also contemplated.

As previously noted, the plasma chamber 118 may include a series of magnets (either permanent magnets or electromagnets) 126 arranged to contain and control the plasma created within the chamber. The characteristics of these magnets 126 can also be arranged to control the characteristics of the plasma as it exits the chamber 18 through the aperture 124. According to other embodiments of the present disclosure, flexible configurations of magnets 126 may be provided adjacent to the exit aperture 124 to achieve effective plasma confinement in the plasma chamber, and to control the nature of the plasma exiting the chamber.

FIG. 4 shows a cross sectional view of the PFG 116 in which magnets 126 (e.g., permanent magnets or electromagnet coils) are be placed around the perimeter of the chamber 116. In one embodiment, the magnets 126 are aligned parallel to the length of the chamber and the poles of adjacent magnets alternate north and south. This arrangement serves to confine the plasma within the plasma chamber. The strength of the magnets 126 is such that there is an appreciable magnetic field (e.g. at least 50 Gauss) along the inner surface of the chamber wall.

Figure 5:
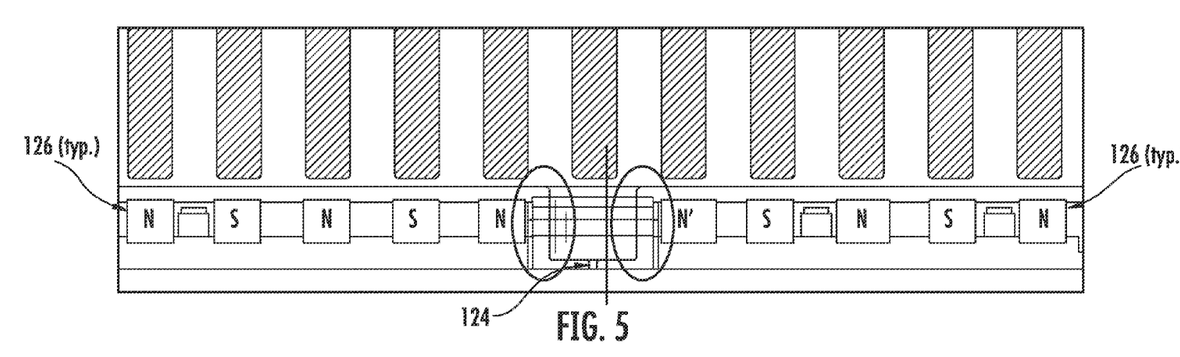
FIG. 5 is a detail view the disclosed plasma flood gun of FIG. 4 showing one exemplary arrangement of magnets in accordance with an embodiment of the present disclosure.

FIG. 5 illustrates the use of an unbalanced cusp field at the exit aperture 124 of the plasma chamber 118. Generally, an arrangement of multicusp magnets around the plasma chamber enhances plasma density by confining the plasma away from the walls of the plasma chamber. It also helps reduce electron temperature by increasing the rate of inelastic electron/neutral collisions. It is desirable to confine the bulk plasma away from the walls of the plasma chamber, while concentrating the plasma towards the exit aperture. Thus, as shown, the magnets are arranged about a majority of the chamber in the aforementioned alternating N—S configuration to produce a repelling dipole field (i.e., repelling the plasma from the surface of the chamber). The exit aperture 124, however, is situated between a N—N pole arrangement to produce a cusp field which directs the plasma toward the exit aperture 124.

To retain the ability to tune the energy of the electrons exiting the aperture, a slightly offset cusp field is provided, in which the strength of magnet N' is weaker than that of magnet N. In this manner there is also a dipole component (oriented perpendicular to the direction of electrons exiting the aperture) which is superimposed on the cusp component (oriented parallel the direction of exiting electrons) at the region the exit aperture 124. The dipole components act as an energy filter for higher energy electrons since the lowest energy electrons can collisionally diffuse across the field, while the higher energy electrons are bent into a certain Larmor radius away from an exit trajectory. It is also possible to create an unbalanced cusp field at the exit aperture 124 by using magnets of equal polarity and equal strength, and placing the magnets at different distances from the exit aperture.

Further a much weaker N—S dipole can also be used across the exit aperture to allow some of the plasma to concentrate near the exit aperture and simultaneously provide dipole filtering. The magnitude of the weaker N—S dipole field across the exit aperture should be a small fraction of the dipole field used to confine the plasma away from the wall. This allows for a sufficient amount of plasma to reach the exit aperture.

Figure 6:
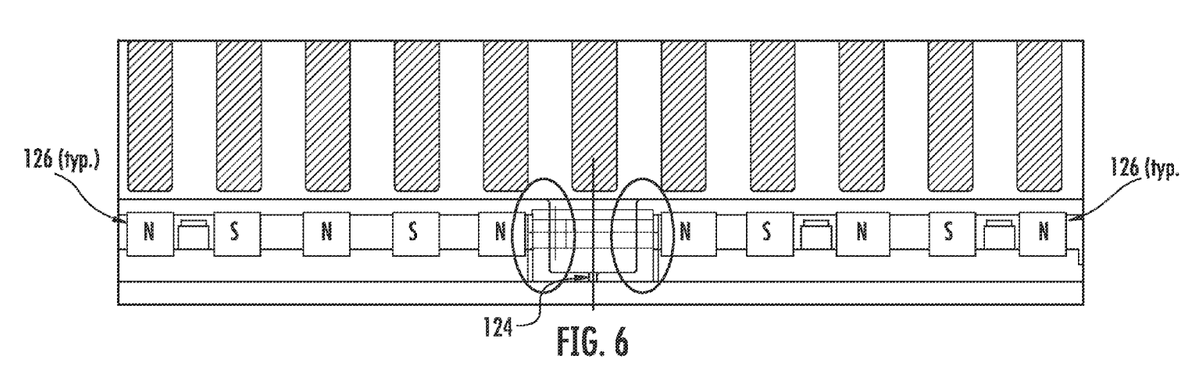
FIGS. 6-6B are detail views of the disclosed plasma flood gun of FIG. 4 showing an alternative arrangement of magnets in accordance with an embodiment of the present disclosure.
Figure 6A:
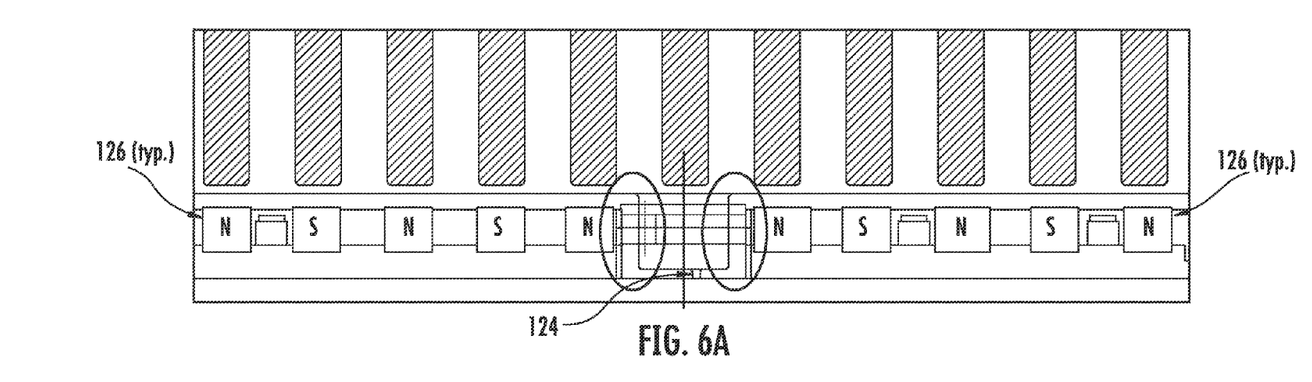

FIG. 6 shows an arrangement having a symmetric cusp field (i.e., using magnets N—N of equal strength) in the region adjacent to the exit aperture 124. This arrangement directs all electrons through the exit aperture, regardless of energy. Alternatively, FIG. 6A illustrates an embodiment where an unbalanced cusp field at the exit aperture 124 is formed by using magnets of equal polarity and equal strength, but with the exit aperture 124 off-center between the magnets. This vertical line denotes the position of where the vertically oriented cusp field is at a maximum and the horizontally directed dipole field is at a minimum.

Figure 6B:
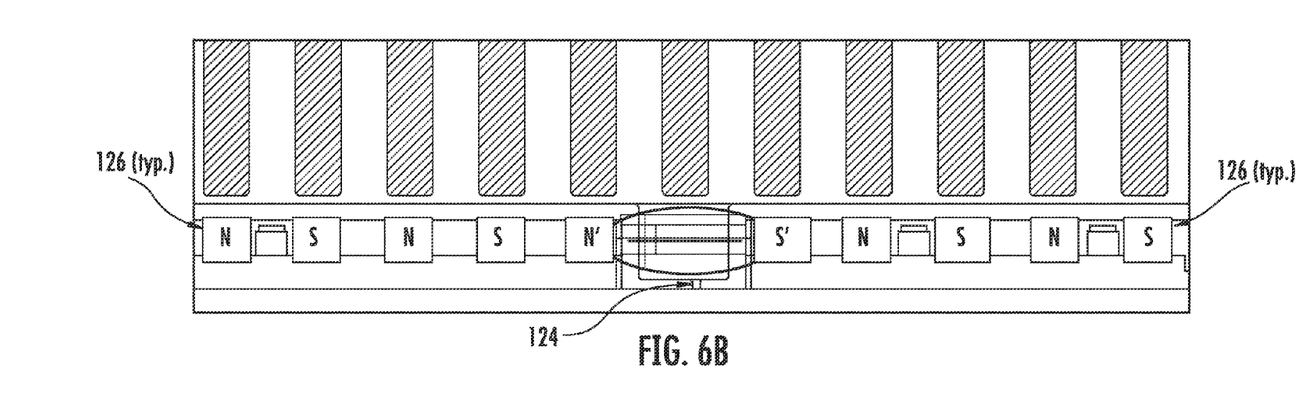

As will be appreciated, the magnets 126 may be flexibly arranged and re-arranged to create a desired magnetic field inside the plasma chamber 118 so as to confine the plasma therein. By changing the strength and shape of the magnetic field, the uniformity and density of the plasma may be adjusted. As a result, electron losses to the sidewalls of the plasma chamber may be reduced. The proper plasma confinement may also reduce plasma potential and sheath width thereby enhancing electron output. FIG. 6B illustrates an embodiment where a pair of magnets are aligned with and disposed on opposite sides of the exit aperture 124. The pair of magnets each has a differing pole configuration and the exit aperture 124 is off-center between the magnets. The dipole field is indicated by the lines disposed between the magnets on opposite sides of the exit aperture 124.

Figure 7:
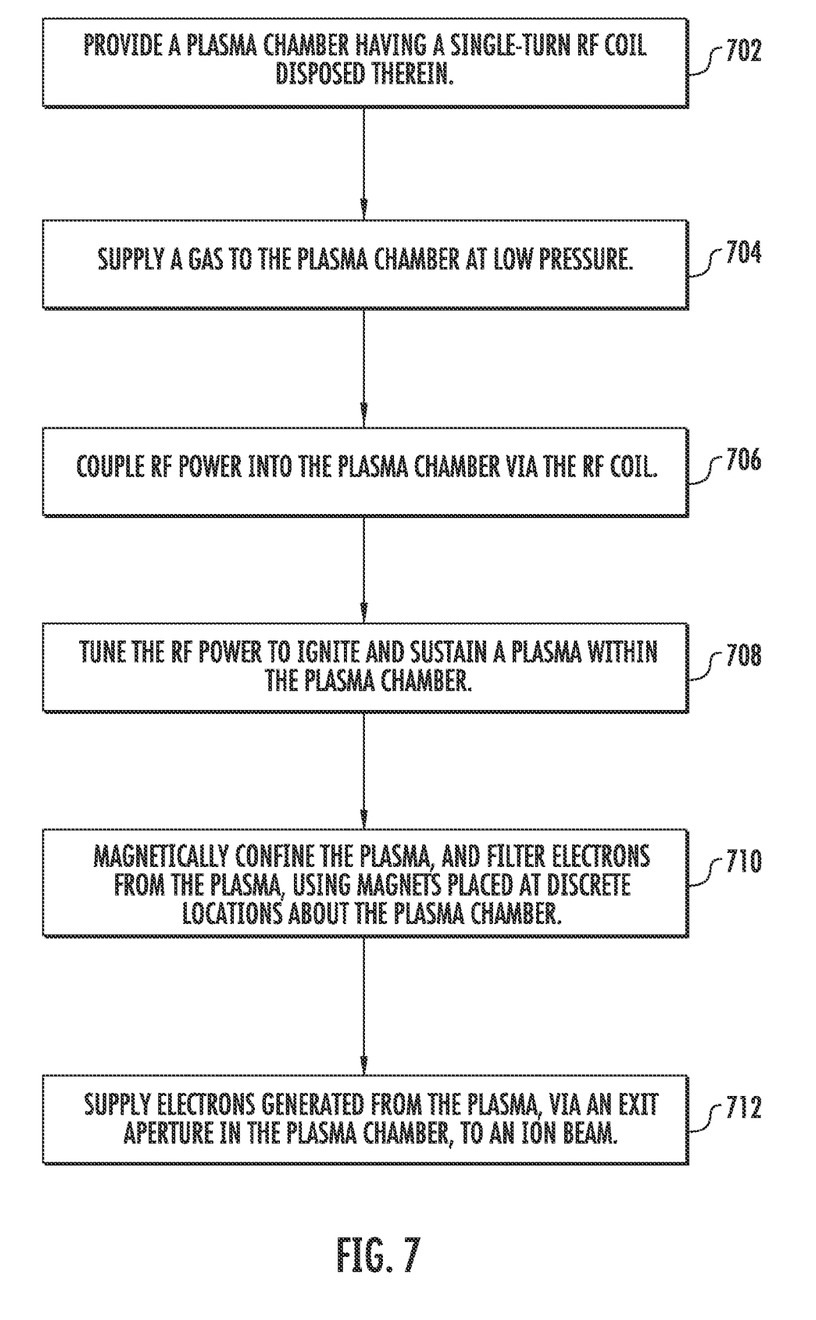
FIG. 7 is a flow chart illustrating a method of providing and using the disclosed plasma flood gun in accordance with an embodiment of the present disclosure.

FIG. 7 is a flow chart illustrating an exemplary method for providing and operating a PFG 116 in accordance with an embodiment of the present disclosure. At step 702, a plasma chamber 118 may be provided having a single-turn RF coil 120 disposed therein. Inside walls of the plasma chamber may be coated with graphite or other non-metallic conductive materials to prevent contamination. The RF coil 120 may be encased in a protective material to protect the coil from exposure to the plasma. At step 704, a xenon (Xe), argon (Ar) or Krypton (Kr) gas may be supplied to the plasma chamber at a low pressure of 10-20 mTorr. Xenon may be a preferred gas for PFG purposes due to a relatively low ionization potential among inert gases and its heavy mass. In step 706, RF power may be coupled into the plasma chamber 118 via the immersed coil 120.

At step 708, the RF power may be tuned to ignite and sustain a Xenon plasma. To break down the gas atoms, it may be desirable to start with a relatively high gas pressure and/or a high RF power setting. Once the plasma has been ignited, it may be sustained at a lower gas pressure and/or RF power setting. At step 710, the plasma may be magnetically confined and electrons from the plasma may be magnetically filtered with magnets (permanent magnets or electromagnets) placed at discrete locations about the plasma chamber 118. The magnets may be arranged in a multi-pole configuration to improve plasma density and uniformity and therefore enhance electron generation. The magnets may be arranged about the exit aperture in an N—N pole arrangement to produce a cusp field which directs the plasma toward the exit aperture 124.

At step 712, the electrons generated from the plasma may be supplied, via an exit aperture (or apertures) in the plasma chamber, to an ion beam just before the beam impacts a substrate. The ion beam may serve as a carrier for drifting, low-energy electrons of the plasma. As soon as the substrate becomes slightly charged to a positive potential, the electrons may be drawn towards the substrate to neutralize the excess of positive charges.

The method described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A plasma flood gun for use in an ion implantation system, the plasma flood gun comprising:
    a plasma chamber having an exit aperture;
    a gas source capable of supplying a gaseous substance to the plasma chamber;
    a single-turn radio-frequency (RF) coil disposed within the plasma chamber, wherein a bent portion of the RF coil is located outside the plasma chamber;
    a power source coupled to the RF coil for inductively coupling radio frequency electrical power into the plasma chamber via the RF coil to excite the gaseous substance to generate a plasma; and
    a pair of magnets aligned with, and disposed on opposite sides of, the exit aperture, the pair of magnets each having the same pole configuration, wherein the exit aperture has a width sufficient to allow charged particles of the plasma to flow therethrough.

2. The plasma flood gun according to claim 1, wherein a portion of an inner surface of the plasma chamber comprises one or more materials selected from a group consisting of graphite and silicon carbide.

3. The plasma flood gun according to claim 1, wherein the RF coil has an encasement to protect the RF coil from exposure to the plasma.

4. The plasma flood gun according to claim 3, wherein the encasement comprises a quartz material.

5. The plasma flood gun according to claim 1, further comprising a plurality of magnets disposed about the plasma chamber.

6. The plasma flood gun according to claim 5, wherein the plurality of magnets are arranged in an alternating pole arrangement to produce one or more magnetic dipoles within the plasma chamber to confine the plasma within the plasma chamber.

7. The plasma flood gun of claim 1, wherein the pair of magnets are of unequal strength to provide an unbalanced cusp field about the exit aperture.

8. The plasma flood gun of claim 1, wherein the pair of magnets are of equal strength.

9. The plasma flood gun of claim 1, wherein the pair of magnets are of equal strength and positioned an unequal distance about the exit aperture.

10. The plasma flood gun of claim 1, wherein a first of the pair of magnets has an N pole configuration and a second of the pair of magnets has an N pole configuration.

11. The plasma flood gun of claim 1, wherein a first of the pair of magnets has an S pole configuration and a second of the pair of magnets has an S pole configuration.

12. A method for providing a plasma flood gun in an ion implantation system, the method comprising:
   providing a plasma chamber having an exit aperture, wherein an entire inner surface of the plasma chamber is free of metal or metal compound;
   supplying at least one gaseous substance to the plasma chamber;
   generating a plasma by coupling radio frequency (RF) power into the plasma chamber via a single-turn coil disposed within the plasma chamber to excite the at least one gaseous substance; and
   causing at least a portion of charged particles from the plasma to exit the plasma chamber via the exit aperture, wherein a pair of magnets are provided on opposite sides of the exit aperture and wherein the pair of magnets each have a same pole configuration.

13. The method of claim 12, further comprising maintaining the plasma away from the inner surface of the plasma chamber using a plurality of magnets.

14. The method of claim 12, further comprising adjusting plasma density and uniformity using a plurality of magnets arranged in a multi-pole configuration.

15. The method of claim 12, wherein the pair of magnets are of unequal strength to provide an unbalanced cusp field about the exit aperture.

16. The method of claim 12, wherein the pair of magnets are of equal strength.

17. The method of claim 12, wherein the pair of magnets are of equal strength and positioned an unequal distance about the exit aperture.

18. The method of claim 12, wherein at least one of an arrangement, polarity and strength of the pair of magnets is selected to bend high energy electrons into a Larmor radius away from an exiting trajectory.

19. The method of claim 12, wherein a portion of the inner surface of the plasma chamber comprises one or more materials selected from a group consisting of graphite and silicon carbide.

20. The method of claim 12, wherein the single-turn coil has an encasement to protect the coil from exposure to the plasma.

21. The method of claim 20, wherein the encasement comprises a quartz material.

22. A plasma flood gun for use in an ion implantation system, the plasma flood gun comprising:
   a plasma chamber having an exit aperture;
   a gas source capable of supplying a gaseous substance to the plasma chamber;
   a single-turn radio-frequency (RF) coil disposed within the plasma chamber;
   a power source coupled to the RF coil for inductively coupling radio frequency electrical power into the plasma chamber via the RF coil to excite the gaseous substance to generate a plasma; and
   a pair of magnets aligned with, and disposed on opposite sides of the exit aperture, the pair of magnets each having the same pole configuration;
   wherein the exit aperture has a width sufficient to allow charged particles of the plasma to flow therethrough.

23. The plasma flood gun of claim 22, wherein a bent portion of the RF coil is located outside the plasma chamber.

* * * * *